(12) United States Patent
Li

(10) Patent No.: US 7,057,902 B2
(45) Date of Patent: Jun. 6, 2006

(54) FASTENING UNIT FOR SECURING PERIPHERAL COMPONENT INTERCONNECT CARDS IN PCI SLOTS IN A HOUSING OF A COMPUTER

(75) Inventor: Chao-Kang Li, Taipei Hsien (TW)

(73) Assignee: Aopen Inc., Taipei (TW)

( * ) Notice: Subject to any disclaimer, the term of this patent is extended or adjusted under 35 U.S.C. 154(b) by 0 days.

(21) Appl. No.: 10/672,164

(22) Filed: Sep. 26, 2003

(65) Prior Publication Data

US 2004/0178318 A1 Sep. 16, 2004

(30) Foreign Application Priority Data

Mar. 10, 2003 (TW) ............................... 92203594 U

(51) Int. Cl.
*H05K 7/18* (2006.01)
(52) U.S. Cl. ....................................... 361/801; 361/759
(58) Field of Classification Search ................ 361/759, 361/740, 801, 801 O, 726, 732, 747, 759 X, 361/686, 798; 211/41.17; 200/52 R, 336
See application file for complete search history.

(56) References Cited

U.S. PATENT DOCUMENTS

| 5,317,483 A | * | 5/1994 | Swindler ..................... 361/801 |
| 5,822,196 A | * | 10/1998 | Hastings et al. ............ 361/801 |
| 5,989,043 A | * | 11/1999 | Han et al. .................... 439/157 |
| 6,618,264 B1 | * | 9/2003 | Megason et al. ........... 361/759 |

* cited by examiner

*Primary Examiner*—Ramon O Ramirez
(74) *Attorney, Agent, or Firm*—Merchant & Gould P.C.

(57) ABSTRACT

A fastening unit for securing brackets on a frame of a computer housing includes a seat having at least two parallel mounting walls that define a mounting space therebetween, and at least one pressing member that has a pressing part, that is disposed in the mounting space, and that is pivoted to the mounting walls so as to be rotatable relative to the seat between a pressing position, in which the pressing part thereof presses a portion of the respective bracket against the frame, and a releasing position, in which the pressing part thereof is moved away from the portion of the respective bracket.

8 Claims, 11 Drawing Sheets

FASTENING UNIT FOR SECURING PERIPHERAL COMPONENT INTERCONNECT CARDS IN PCI SLOTS IN A HOUSING OF A COMPUTER

CROSS-REFERENCE TO RELATED APPLICATION

This application claims priority of Taiwanese application No. 092203594, filed on Mar. 10, 2003.

BACKGROUND OF THE INVENTION

1. Field of the Invention

This invention relates to a fastening unit, more particularly to a fastening unit for securing peripheral component interconnect cards in a housing of a computer.

2. Description of the Related Art

FIG. 1 illustrates a conventional fastening member 87 for securing brackets 86 on a frame 85 that defines an opening in a housing 81 of a personal computer 8. The opening exposes peripheral component interconnect cards 84 in respective PCI slots 83 in the housing 81. Each peripheral component interconnect card 84 can be secured to a respective bracket 86 through screw means. The fastening member 87 is in the form of a plate, and includes two opposite ends 871, 873 that are secured to holding members (not shown) in the housing 81 of the computer 8 in a manner to permit the fastening member 87 to press top portions 861 of the brackets 86 against a top end of the frame 85. The aforesaid conventional fastening member 87 is disadvantageous in that detachment of the fastening member 87 from the holding members for installation or dismounting of a peripheral component interconnect card 84 may result in unstable electrical connection or even disconnection between other peripheral component interconnect cards 84 and terminals (not shown) in the PCI slots 83.

FIG. 2 illustrates another conventional fastening member 97 that includes a seat 971 which has parallel mounting walls 970. Each mounting wall 970 has a toothed inner wall face 974. Two adjacent ones of the mounting walls 970 define a mounting space therebetween. A plurality of pressing members 972 (only one pressing member 972 is shown in FIG. 2) are respectively disposed in the mounting spaces in the seat 971, and respectively press the top portions 861 of the brackets 86 against the top end of the frame 85 when the pressing members 972 are disposed at a pressing position. Each pressing member 972 has two opposite toothed side faces 973 which respectively engage the toothed inner wall faces 974 of the adjacent mounting walls 970 so as to retain the pressing member 972 at the pressing position. The aforesaid conventional fastening member 97 is disadvantageous in that the toothed inner wall face 974 of each mounting wall 970 and the toothed side faces 973 of each pressing member 972 tend to wear out easily upon each installation or detachment of the pressing member 972.

SUMMARY OF THE INVENTION

Therefore, the object of the present invention is to provide a fastening unit that is capable of overcoming the aforementioned drawbacks of the prior art.

According to the present invention, there is provided a fastening unit for securing brackets on a frame that defines an opening in a housing of a personal computer. The opening exposes peripheral component interconnect cards in respective PCI slots in the housing. Each of the peripheral component interconnect cards is secured to a respective one of the brackets. The fastening unit comprises: a seat adapted to be mounted on the frame and having at least two parallel mounting walls that define a mounting space therebetween, the mounting space being adapted to receive a portion of one of the brackets; and at least one pressing member that has a pressing part, that is disposed in the mounting space, and that is pivoted to the mounting walls so as to be rotatable relative to the seat between a pressing position, in which the pressing part thereof is adapted to press the portion of said one of the brackets against the frame, and a releasing position, in which the pressing part thereof is adapted to be moved away from the portion of said one of the brackets.

BRIEF DESCRIPTION OF THE DRAWINGS

In drawings which illustrate embodiments of the invention.

DETAILED DESCRIPTION OF THE PREFERRED EMBODIMENTS

Figure 1:
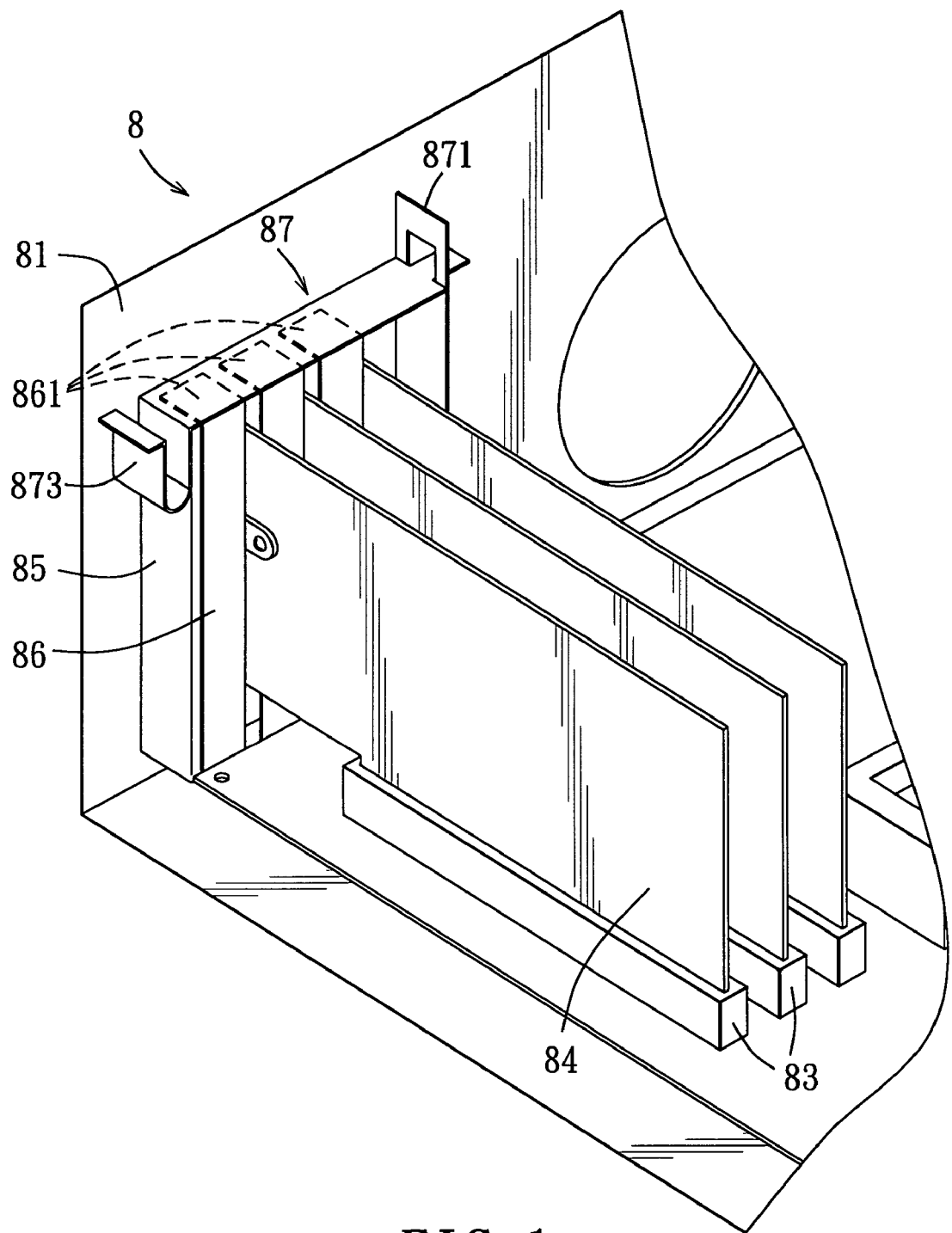
FIG. 1 is a fragmentary perspective view to illustrate how a conventional fastening member secures brackets that are used for securing peripheral component interconnect cards in PCI slots in a computer.
Figure 2:
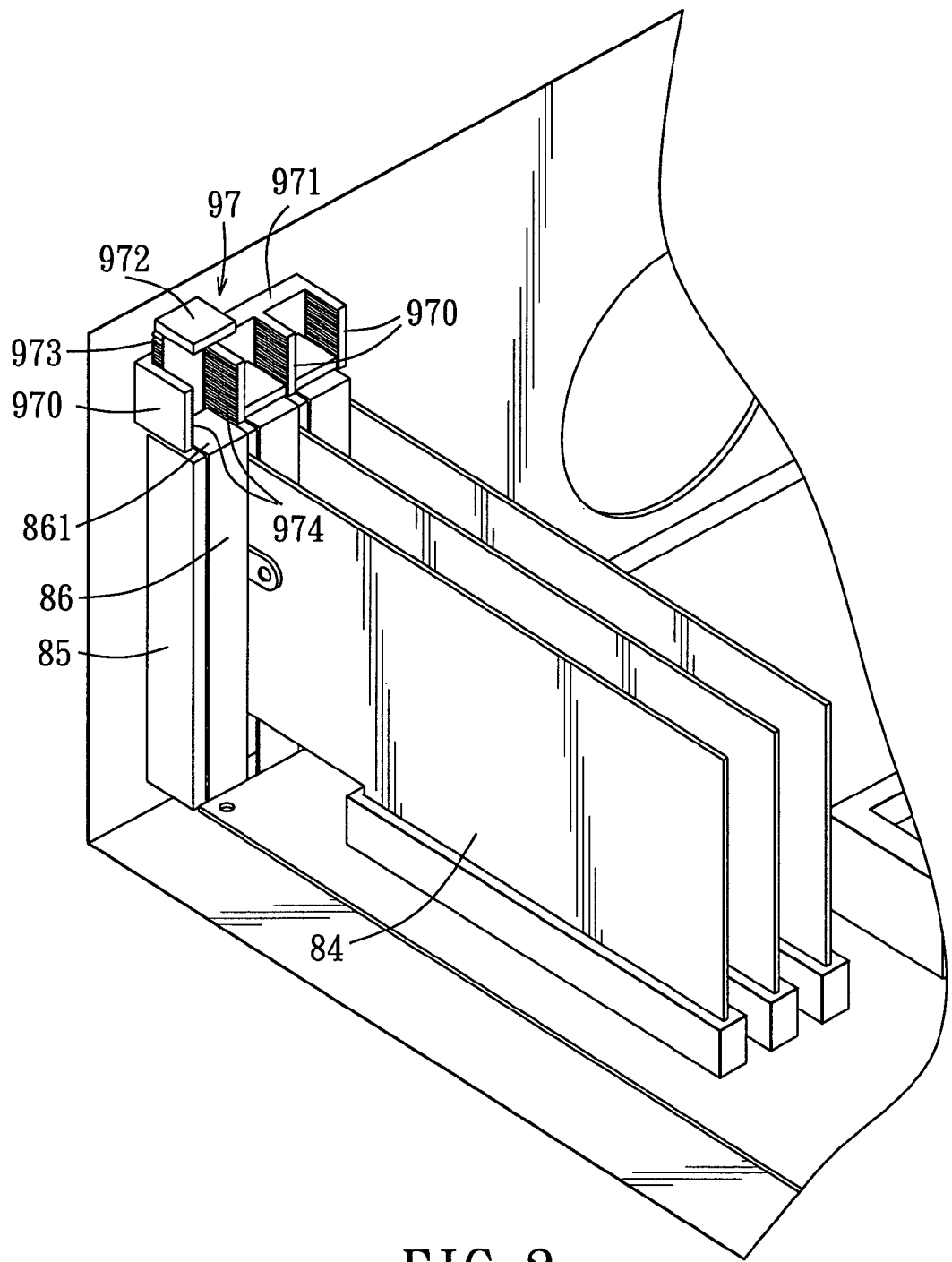
FIG. 2 is a fragmentary perspective view of another conventional fastening member.

For the sake of brevity, like elements are denoted by the same reference numerals throughout the disclosure.

Figure 8:
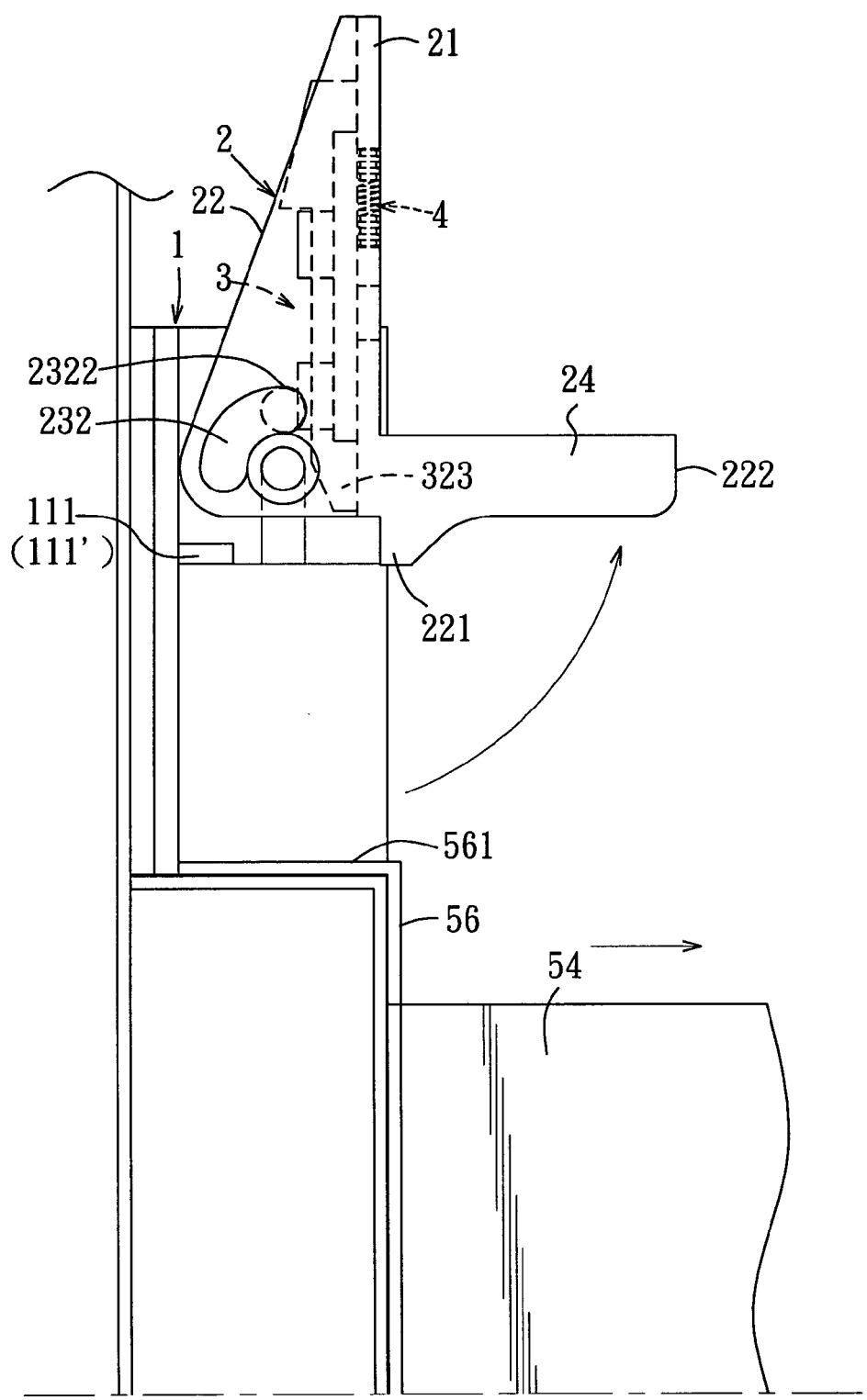
FIG. 8 is a fragmentary side view to illustrate how the pressing member is moved from the pressing position to the releasing position.
Figure 9:
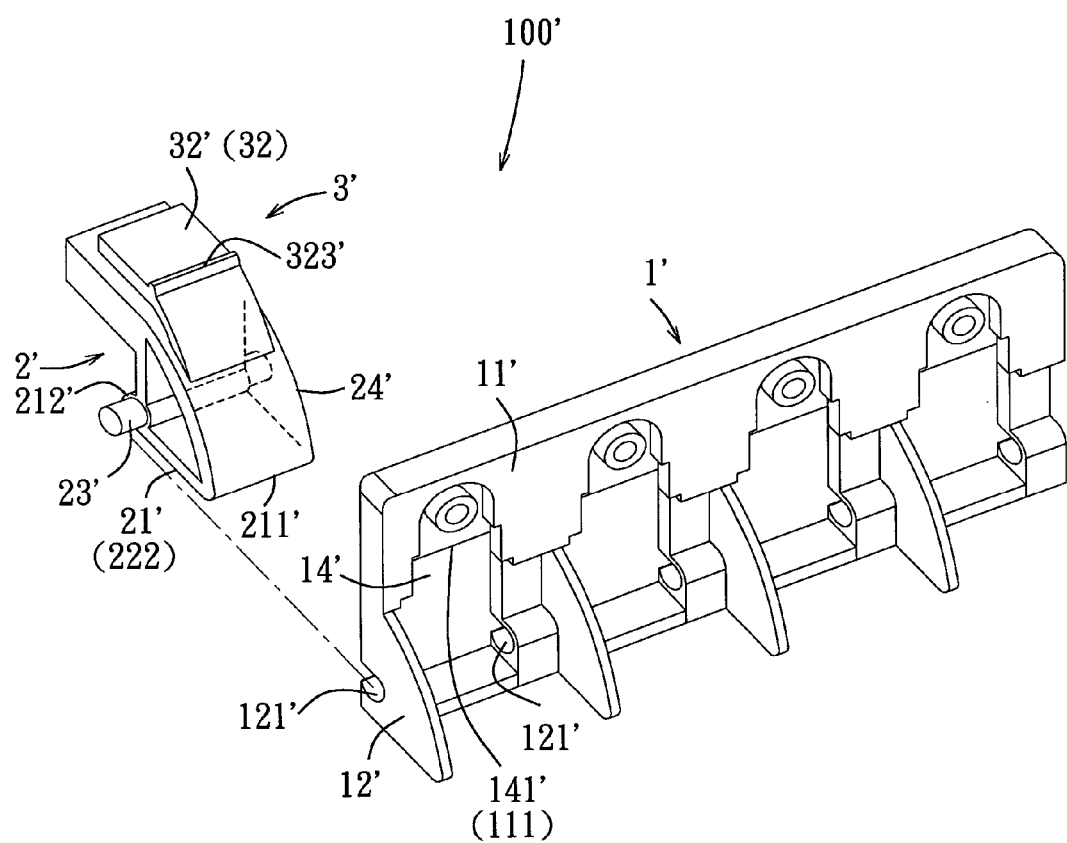
FIG. 9 is an exploded perspective view of the second preferred embodiment of the fastening unit according to this invention.
Figure 10:
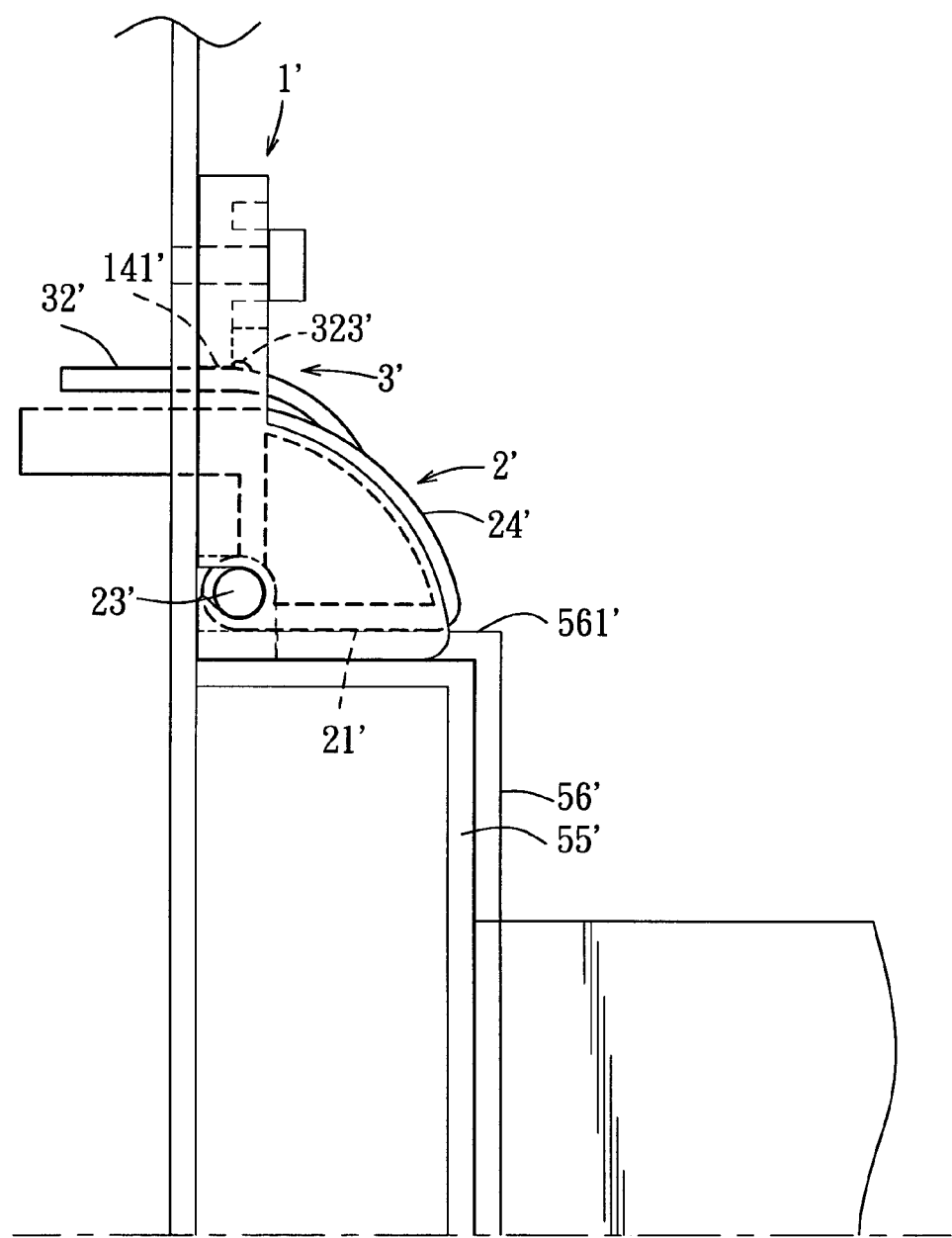
FIG. 10 is fragmentary side view to illustrate how an interlocking mechanism is disposed at a locking position so as to lock a pressing member of the fastening unit of FIG. 9 at a pressing position.
Figure 11:
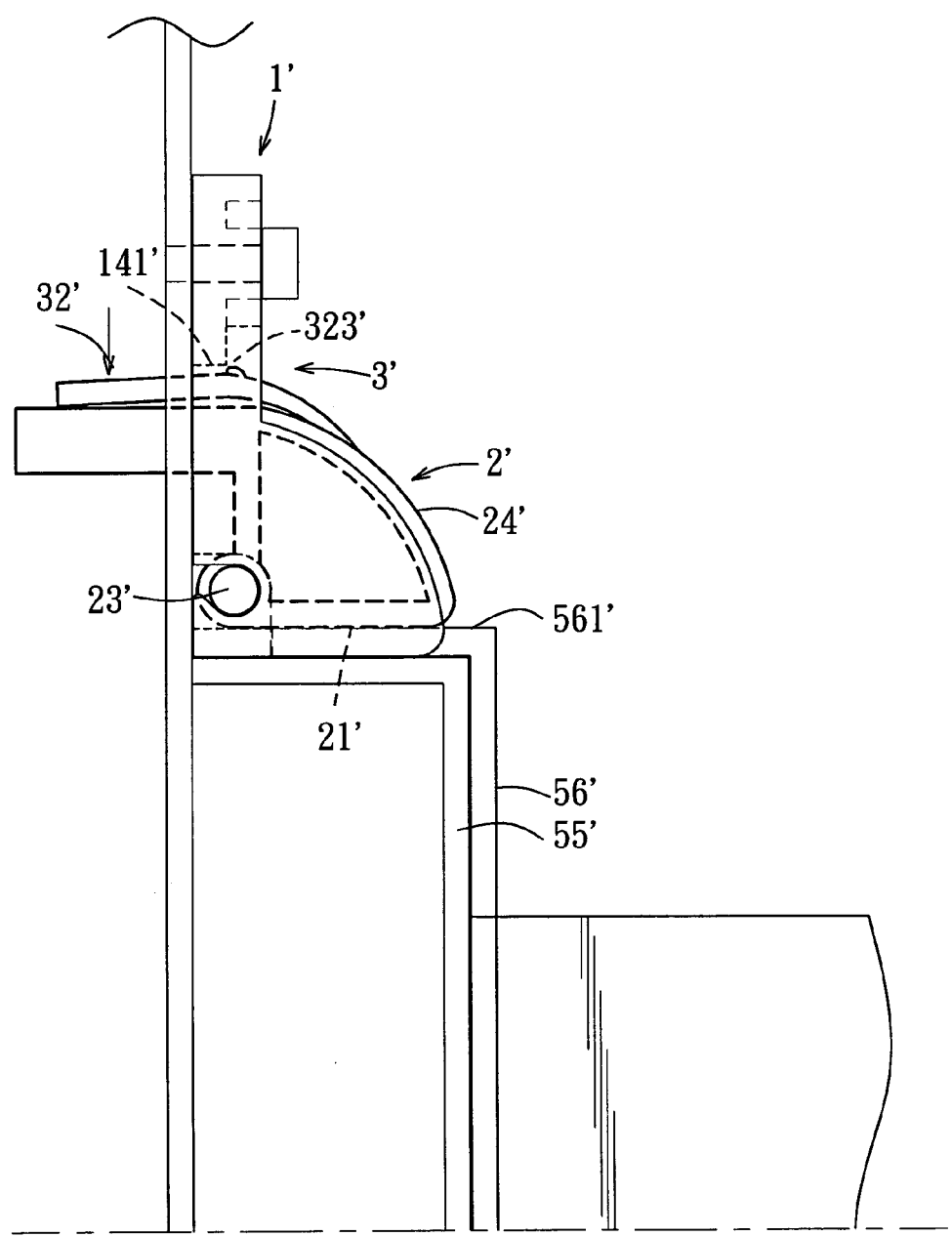
FIG. 11 is fragmentary side view to illustrate how the interlocking mechanism is moved from the locking position to an unlocking position so as to permit movement of the pressing member of the fastening unit of FIG. 9 from the pressing position to a releasing position.
Figure 12:
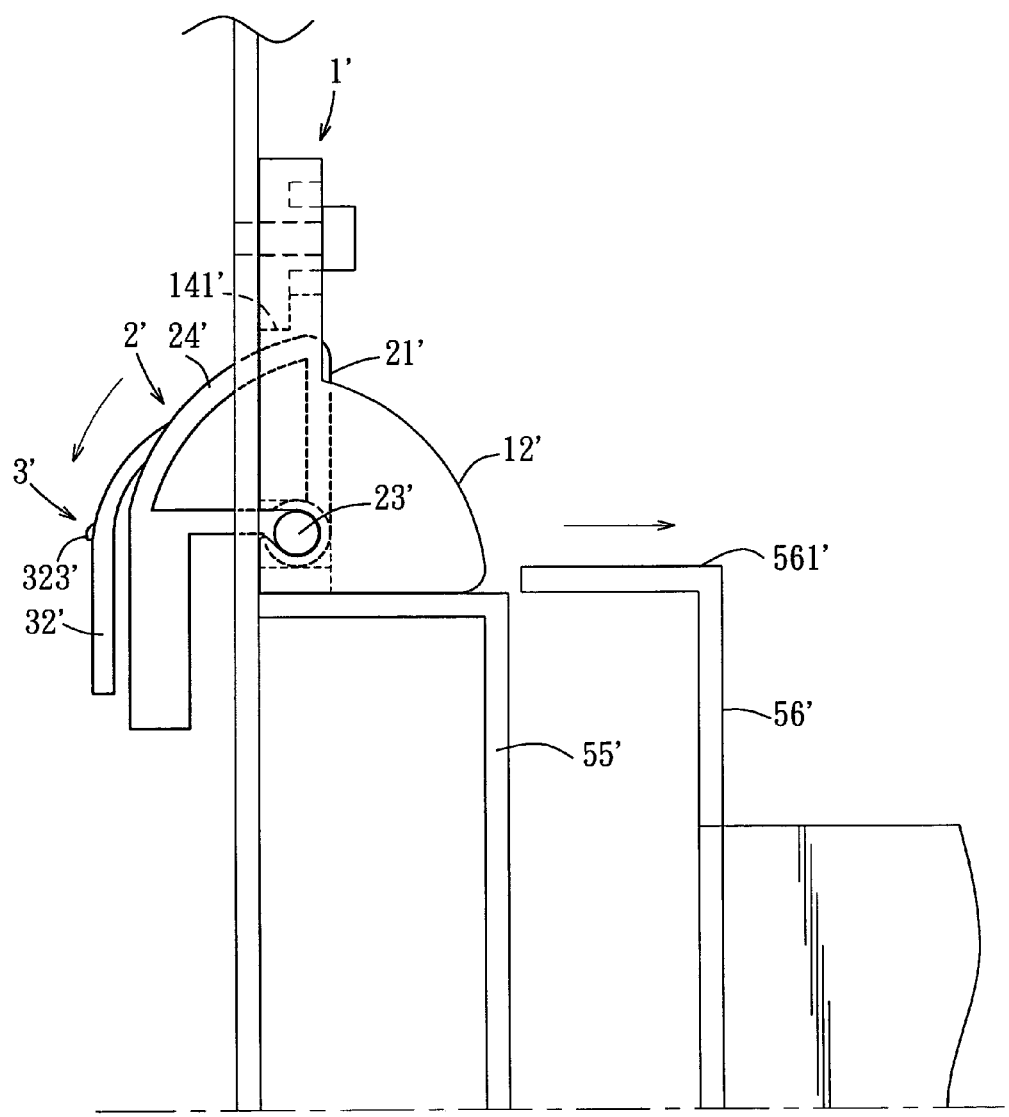
FIG. 12 is a fragmentary side view to illustrate how the pressing member is moved from the pressing position to the releasing position.

FIGS. 3 to 6 illustrate the first preferred embodiment of a fastening unit 100 according to the present invention. The fastening unit 100 is used to firmly secure brackets 56 on a frame 55 of a housing 51 of a personal computer 5. Each peripheral component interconnect card 54 is secured to a respective bracket 56 through screw means (not shown) that extend through an ear 562 of the bracket 56. The fastening unit 100 includes: a seat 1 adapted to be mounted on the frame 55 and having a supporting wall 11 and a plurality of parallel mounting walls 12 that project from the supporting wall 11, each adjacent pair of the mounting walls 12 defining a mounting space 13 therebetween, the mounting space 13 being adapted to receive a top portion 561 of one of the brackets 56; and a plurality of pressing members 2, each of which has a pressing part 222, each of which is disposed in the mounting space 13 between two adjacent ones of the mounting walls 12, and each of which is pivoted to the two adjacent mounting walls 12 so as to be rotatable relative to the seat 1 between a pressing position (see FIG. 6), in which the pressing part 222 thereof is adapted to press the top portion 561 of said one of the brackets 56 against the frame 55, and a releasing position (see FIG. 8), in which the pressing part 222 thereof is adapted to be moved away from the top portion 561 of said one of the brackets 56.

A plurality of interlocking mechanisms 3 are provided to lock the pressing members 2 at the pressing position, respectively. Each of the interlocking mechanisms 3 includes a first engaging member 111 that is formed on and that projects from the supporting wall 11 of the seat 1 into the mounting space 13 between two adjacent ones of the mounting walls 12, and a second engaging member 32 that is mounted movably on the respective pressing member 2. The second engaging member 32 has an engaging end 323 that is releasably engageable with the first engaging member 111 (see FIG. 6) so as to lock the respective pressing member 2 at the pressing position and so as to prevent rotation of the respective pressing member 2.

Each two adjacent ones of the mounting walls 12 of the seat 1 are formed with a pair of opposing pivot grooves 121. Each pressing member 2 is adapted to be disposed above the top portion 561 of the respective bracket 56, and includes a base wall 21 that has first and second ends 211, 212 and two opposite sides transverse to the first and second ends 211, 212 and parallel to the adjacent mounting walls 12, two opposite side walls 22 that respectively project from the opposite sides of the base wall 21 in a first transverse direction relative to the base wall 21, and two opposing pivot studs 23 that are disposed adjacent to the second end 212 of the base wall 21 and that respectively and oppositely project from the side walls 22 in a second transverse direction relative to the side walls 22 into the pivot grooves 121 in the two adjacent mounting walls 12 so as to permit rotation of the pressing member 2 relative to the seat 1.

Figure 7:
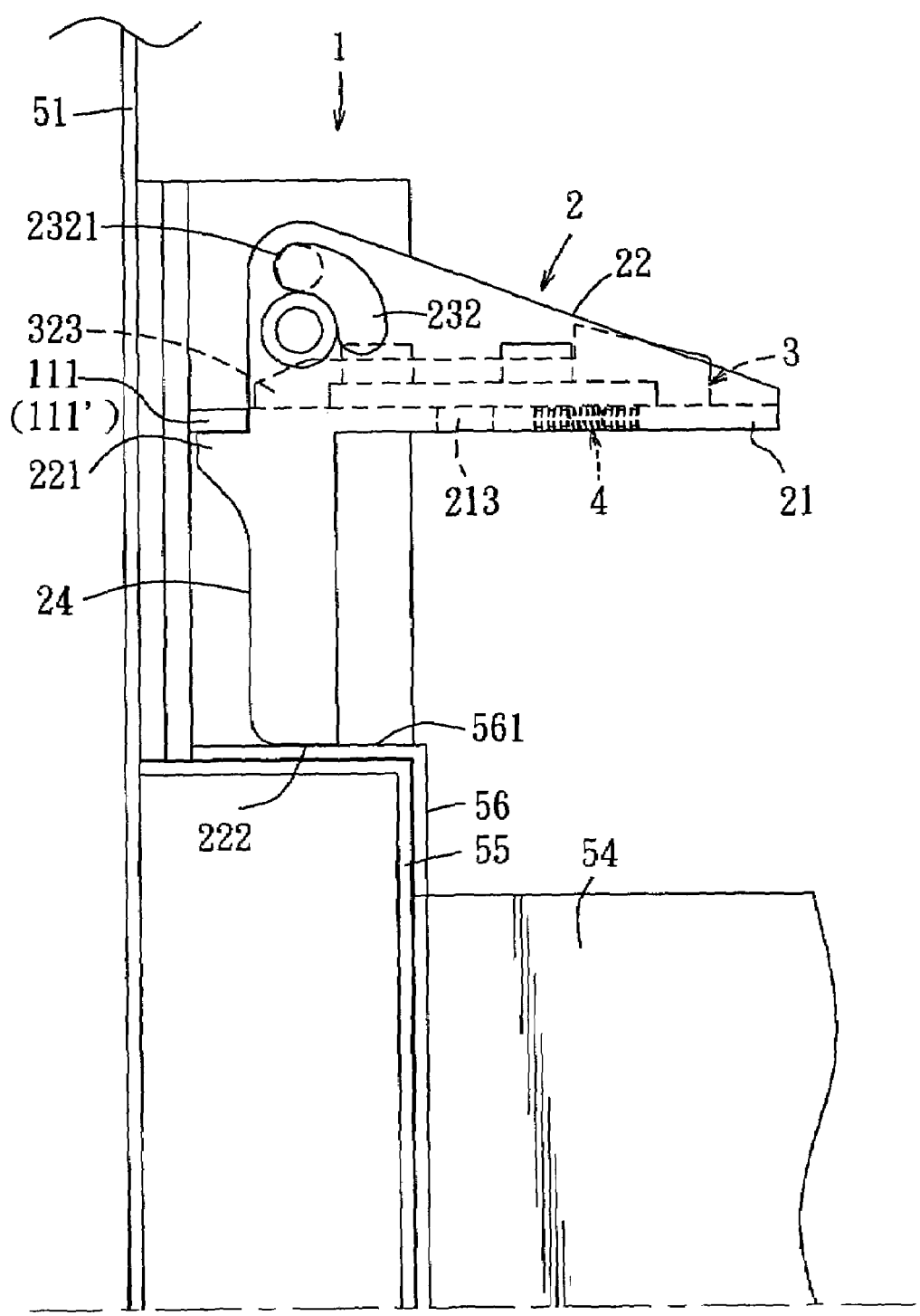
FIG. 7 is a fragmentary side view to illustrate how the interlocking mechanism is moved from the locking position to an unlocking position so as to permit movement of the pressing member of the fastening unit of FIG. 3 from the pressing position to a releasing position.

The pivot groove 121 in each mounting wall 12 has an open end 1210 that opens downwardly. The pivot studs 23 of each pressing member 2 are respectively inserted into the corresponding pivot grooves 121 through the open ends 1210. The side walls 22 of each pressing member 2 are respectively formed with two opposing arcuate slots 232, each of which is disposed adjacent to a respective one of the pivot studs 23 and each of which is defined by a slot-defining wall that has two opposite ends 2321, 2322 (see FIG. 5). Each two adjacent ones of the mounting walls 12 of the seat 1 are further formed with a pair of opposing limiting studs 122 that respectively project therefrom into the arcuate slots 232 in the side walls 22 of the respective pressing member 2 so as to support the respective pressing member 2 on the adjacent mounting walls 12. One of the opposite ends 2321 of the slot-defining wall of each arcuate slot 232 comes into contact with the respective one of the limiting studs 122 when the respective pressing member 2 is positioned at the pressing position (see FIGS. 6 and 7). The other of the opposite ends 2322 of the slot-defining wall comes into contact with the respective one of the limiting studs 122 when the respective pressing member 2 is positioned at the releasing position (see FIG. 8). Accordingly, rotation of each pressing member 2 is limited between the pressing position and the releasing position.

Each pressing member 2 further includes a leg 24 that projects from the second end 212 of the base wall 21 in the first transverse direction, that is opposite to the side walls 22, and that has a free end which defines the pressing part 222 of the pressing member 2. The free end of the leg 24 abuts against the top portion 561 of the respective bracket 56 when the respective pressing member 2 is disposed at the pressing position (see FIGS. 6 and 7), and is moved away from the top portion 561 of the respective bracket 56 when the respective pressing member 2 (see FIG. 8) is moved from the pressing position to the releasing position.

In this embodiment, the first engaging member 111 of each interlocking mechanism 3 is in the form of a bar 111' that extends between the adjacent mounting walls 12. The side walls 22 of each pressing member 2 define a plate-receiving space 220 therebetween. The second engaging member 32 is in the form of a sliding plate 32' that is slidably received in the plate-receiving space 220 between the side walls 22 of the respective pressing member 2, that has an engaging end 323 disposed adjacent to the second end 212 of the base wall 21 of the respective pressing member 2, and that is slidable in a third transverse direction relative to the first and second transverse directions between a locking position (see FIG. 6), in which the engaging end 323 of the sliding plate 32' extends outwardly of the plate-receiving space 220 and is disposed above and confronts the bar 111' when the respective pressing member 2 is positioned at the pressing position so as to prevent rotation of the respective pressing member 2 in a first direction, and an unlocking position (see FIG. 7), in which the engaging end 323 of the sliding plate 32' is moved away from the bar 111' and into the plate-receiving space 220 so as to permit rotation of the respective pressing member 2 in the first direction.

The base wall 21 of each pressing member 2 is formed with a through-hole 213 that is defined by a hole-defining wall, and a first mounting stud 214 that projects from the hole-defining wall into the through-hole 213. The sliding plate 32' is formed with a rib 320 that projects into the through-hole 213, and a second mounting stud 322 that projects from the rib 320 toward the first mounting stud 322. The interlocking mechanism 3 further includes a coil spring 4 that is sleeved on the first and second mounting studs 214, 322 so as to urge the sliding plate 32' to move to the locking position (see FIG. 6) when the respective pressing member 2 is positioned at the pressing position.

The side walls 22 of each pressing member 2 are formed with guiding protrusions 215 projecting therefrom into the plate-receiving space 220 and cooperatively defining two opposing guiding channels 216 thereunder. The sliding plate 32' has two opposite sides that are respectively formed with two opposing wings 321 that are slidingly received in the guiding channels 216 between the side walls 22 of the respective pressing member 2.

Each interlocking mechanism 3 further includes a limiting tongue 221 that projects from the leg 24 of the respective pressing member 2 in the third transverse direction away from the first end 211 of the base wall 21 and that is disposed at a position adjacent to the second end 212 of the base wall 21 so as to be disposed below and to confront the bar 111' when the respective pressing member 2 is disposed at the pressing position, thereby preventing rotation of the respective pressing member 2 in a second direction opposite to the first direction.

Figure 3:
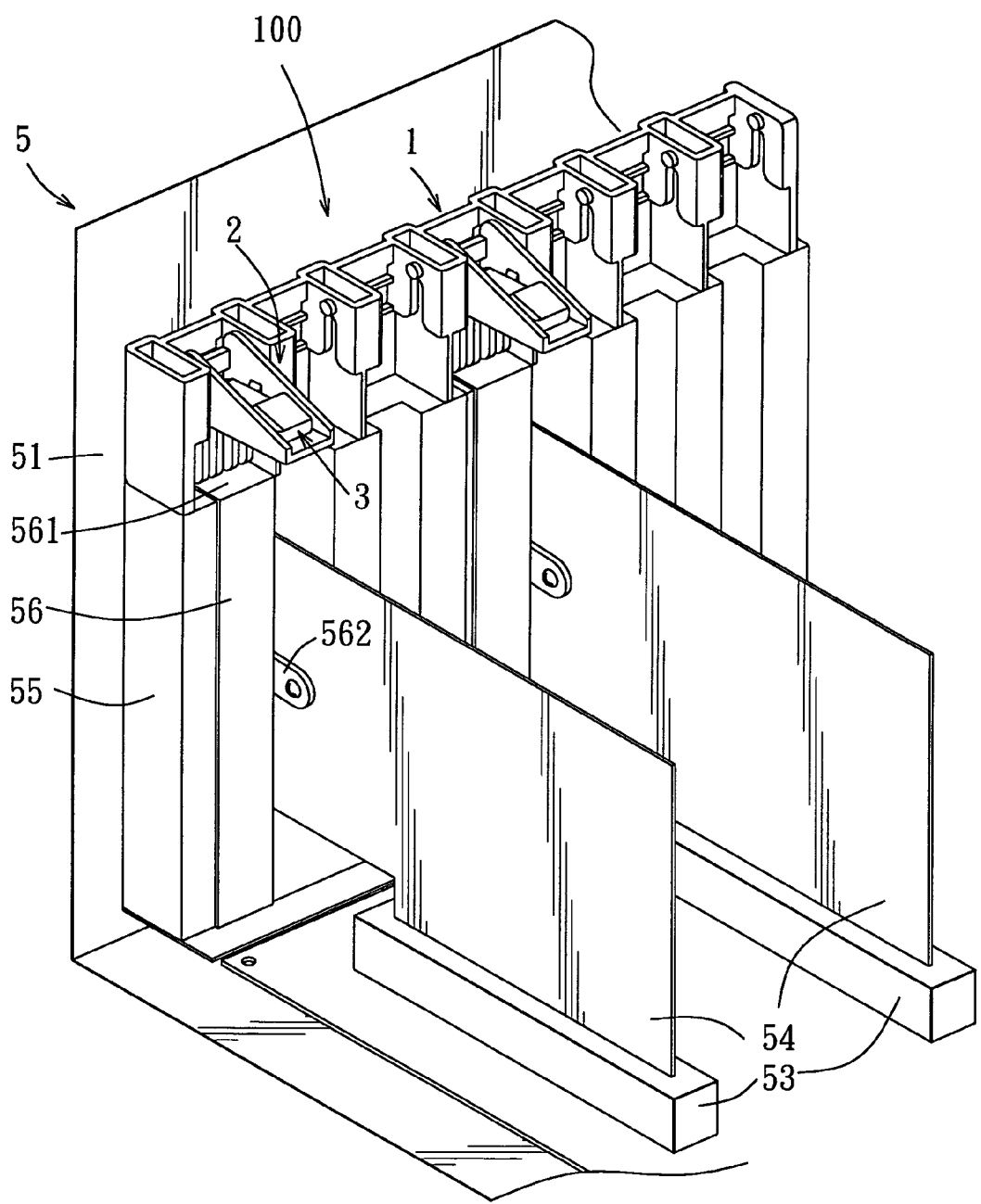
FIG. 3 is a fragmentary perspective view of the first preferred embodiment of a fastening unit according to this invention, illustrating how brackets in a personal computer are secured by the fastening unit.
Figure 4:
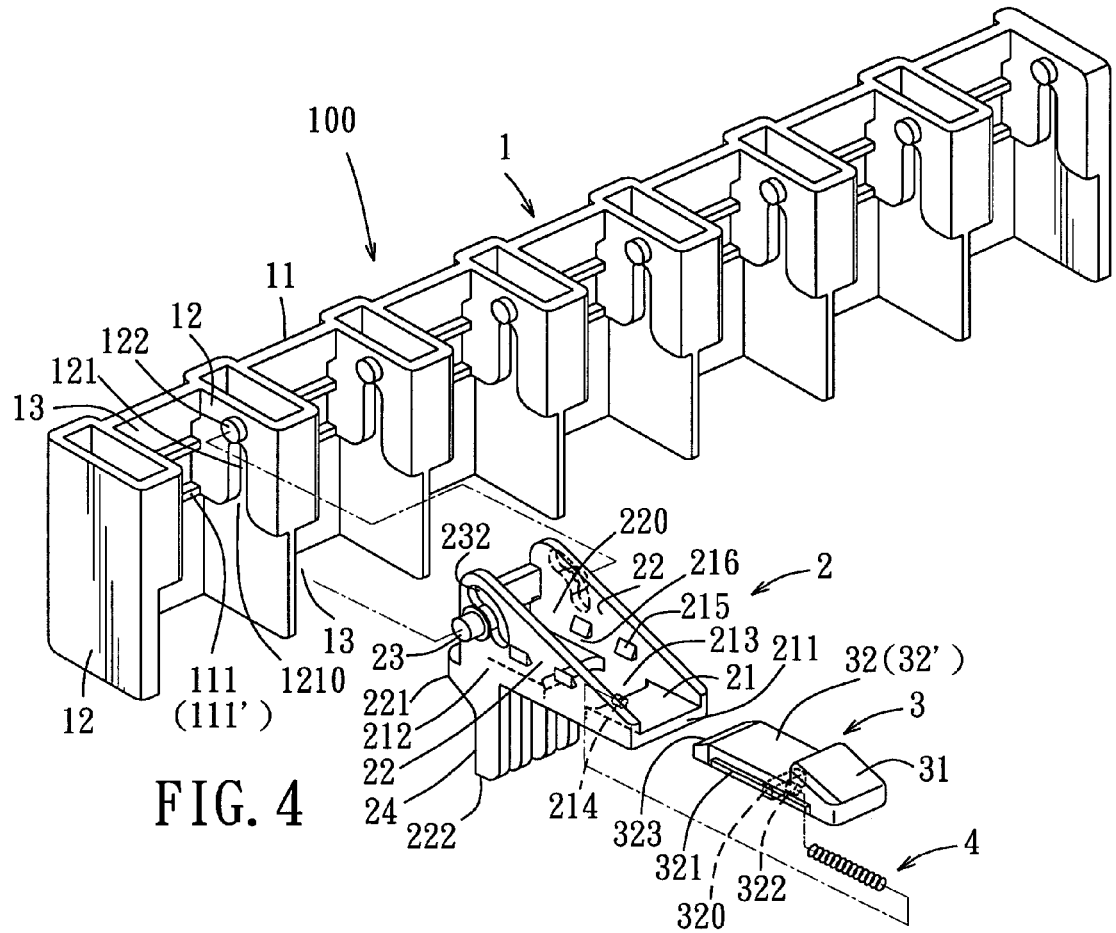
FIG. 4 is an exploded perspective view of the fastening unit of FIG. 3.
Figure 5:
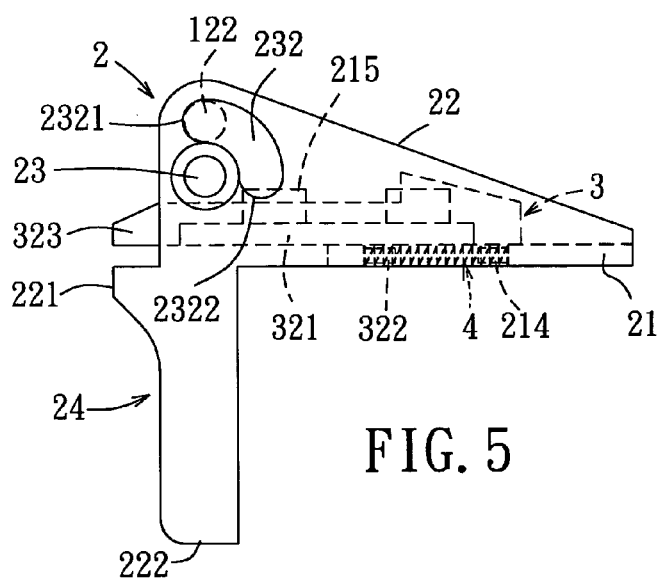
FIG. 5 is a side view of the fastening unit of FIG. 3.
Figure 6:
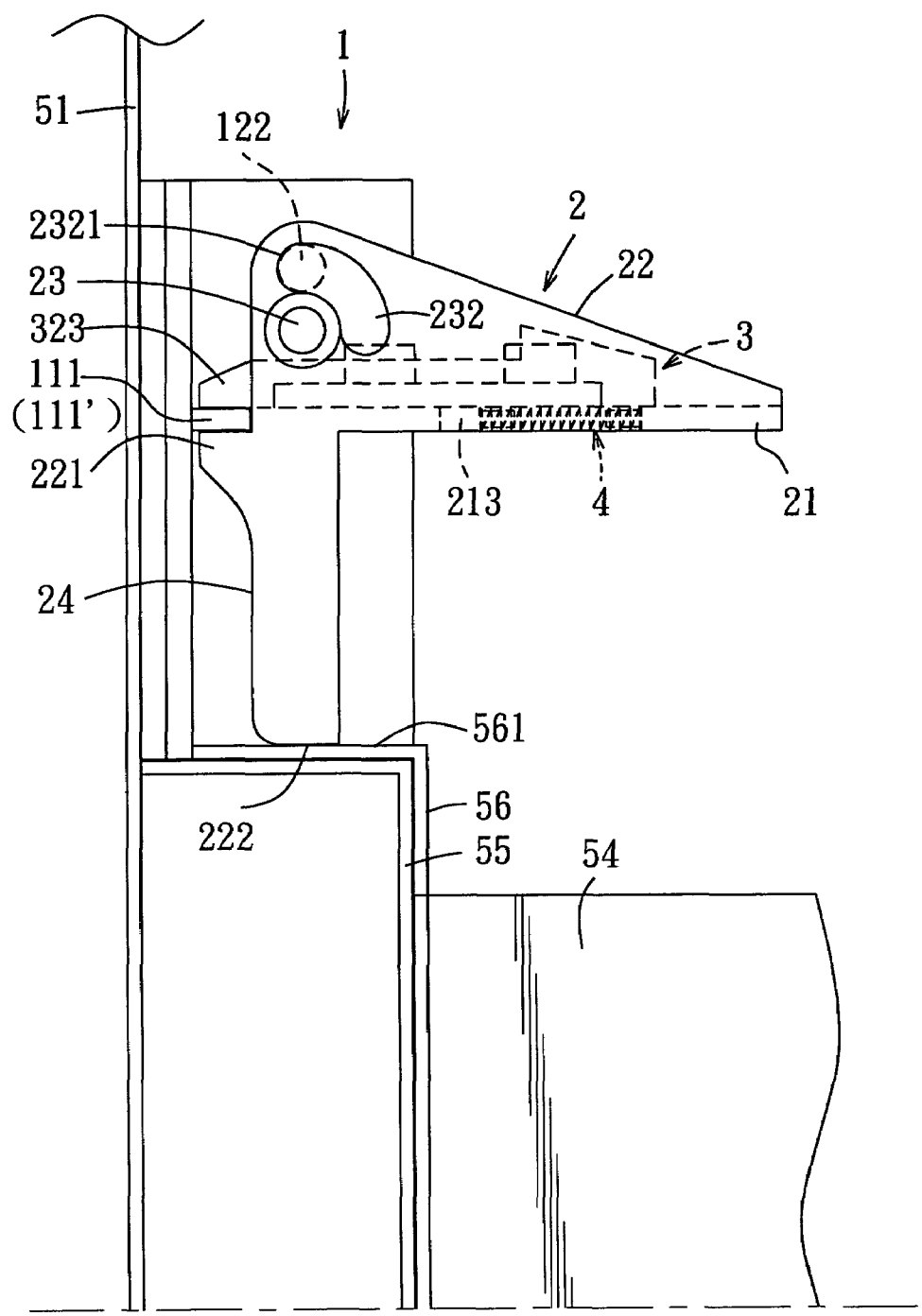
FIG. 6 is a fragmentary side view to illustrate how an interlocking mechanism is disposed at a locking position so as to lock a pressing member of the fastening unit of FIG. 3 at a pressing position.

FIGS. 9 to 12 illustrate a second preferred embodiment of the fastening unit 100' that is modified from the previous embodiment shown in FIG. 3. In this embodiment, each two adjacent ones of the mounting walls 12' of the seat 1' respectively have pivot ends that are respectively formed with two opposing grooves 121'. A supporting wall 11' of the seat 1' extends between and interconnects the pivot ends of the mounting walls 12' and is formed with a notch 14' which opens downwardly and which is defined by a notch-defining wall. The notch-defining wall has a top wall portion 141' that is disposed above the grooves 121' and that defines the first engaging member 111 of the respective interlocking mechanism 3'. Each pressing member 2' includes a base wall 21' that has first and second ends 211', 212' and two opposite sides transverse to the first and second ends 211', 212' and parallel to the adjacent mounting walls 12', that defines the pressing part 222 of the pressing member 2', that is adapted to abut against the top portion 561' of the respective bracket 56' (see FIG. 10) when the respective pressing member 2' is disposed at the pressing position, and that is adapted to move away from the top portion 561' of the respective bracket 56' (see FIG. 12) when the respective pressing member 2' is moved from the pressing position to the releasing position. Each pressing member 2' further includes a pair of pivot studs 23' that project oppositely from the second end 212' of the base wall 21' at the opposite sides of the base wall 21' into the grooves 121', and a curved wall 24' that is formed with an elastic part 32' having an engaging protrusion 323' which defines the second engaging member 32 of the respective interlocking mechanism 3' and that extends curvedly from the first end 211' of the base wall 21' toward the second end 212' of the base wall 21' in such a manner that the engaging protrusion 323' elastically engages the top wall portion 141' of the notch-defining wall when the respective pressing member 2' is disposed at the pressing position. The elastic part 32' is elastic so as to permit disengagement between the engaging protrusion 323' and the top wall portion 141' of the notch-defining wall upon being pressed (see FIG. 11), thereby permitting rotation of the respective pressing member 2' from the pressing position to the releasing position.

By virtue of the pivot action of the pressing members 2 (2') on the seat 1 (1') during loosening or fastening of the brackets 56 (56') on the frame 55 (55') of the housing 51 (51'), the aforesaid drawbacks as encountered in the prior art can be eliminated.

With the invention thus explained, it is apparent that various modifications and variations can be made without departing from the spirit of the present invention. It is therefore intended that the invention be limited only as recited in the appended claims.

I claim:

1. A fastening unit for securing brackets on a frame of a housing of a personal computer that includes interface cards which are to be secured to the brackets, said fastening unit comprising:

a seat adapted to be mounted on the frame and having at least two parallel mounting walls that define a mounting space therebetween, said mounting space being adapted to receive a portion of one of the brackets;

at least one pressing member that has a pressing part, that is disposed in said mounting space, and that is pivoted to said mounting walls so as to be rotatable relative to said seat between a pressing position, in which said pressing part thereof is adapted to press the portion of said one of the brackets against the frame, and a releasing position, in which said pressing part thereof is adapted to be moved away from the portion of said one of the brackets; and at least an interlocking mechanism that includes a first engaging member formed on said seat between said mounting walls, and a second engaging member mounted movably on said pressing member, said second engaging member being releasably engageable with said first engaging member so as to lock said pressing member at said pressing position and so as to prevent rotation of said pressing member, wherein said mounting walls of said seat are formed with a pair of opposing pivot grooves, said pressing member being adapted to be disposed above the portion of the respective one of the brackets and including a base wall that has first and second ends and two opposite sides transverse to said first and second ends and parallel to said mounting walls, two opposite side walls that respectively project from said opposite sides of said base wall in a first transverse direction relative to said base wall, and two opposing pivot studs that are disposed adjacent to said second end of said base wall and that respectively and oppositely project from said side walls in a second transverse direction relative to said side walls into said pivot grooves so as to permit rotation of said pressing member relative to said seat.

2. The fastening unit of claim 1, wherein said pivot grooves in said mounting walls respectively have open ends that open downwardly, said pivot studs being respectively inserted into said pivot grooves through said open ends, said side walls of said pressing member being respectively formed with two opposing arcuate slots, each of which is disposed adjacent to a respective one of said pivot studs and each of which is defined by a slot-defining wall that has two opposite ends, said mounting walls of said seat being further formed with a pair of opposing limiting studs that respectively project therefrom into said arcuate slots so as to support said pressing member on said mounting walls, one of said opposite ends of said slot-defining wall of each of said arcuate slots coming into contact with the respective one of said limiting studs when said pressing member is positioned at said pressing position, the other of said opposite ends of said slot-defining wall coming into contact with the respective one of said limiting studs when said pressing member is positioned at said releasing position, thereby limiting rotation of said pressing member between said pressing position and said releasing position.

3. The fastening unit of claim 2, wherein said pressing member further includes a leg that projects from said second end of said base wall in said first transverse direction, that is opposite to said side walls of said pressing member, and that has a free end which defines said pressing part of said pressing member, which is adapted to abut against the portion of the respective one of the brackets when said pressing member is disposed at said pressing position, and which is adapted to move away from the portion of the respective one of the brackets when said pressing member is moved from said pressing position to said releasing position.

4. The fastening unit of claim 3, wherein said first engaging member is in the form of a bar extending between said mounting walls, said side walls of said pressing member defining a plate-receiving space therebetween, said second engaging member being in the form of a sliding plate that is slidably received in said plate-receiving space, that has an engaging end disposed adjacent to said second end of said base wall, and that is slidable in a third transverse direction relative to said first and second transverse directions between a locking position, in which said engaging end of said sliding plate extends outwardly of said plate-receiving space and is disposed above and confronts said bar when said pressing member is positioned at said pressing position so as to prevent rotation of said pressing member in a first direction, and an unlocking position, in which said engaging end of said sliding plate is moved away from said bar and into said plate-receiving space so as to permit rotation of said pressing member in said first direction.

5. The fastening unit of claim 4, wherein said base wall of said pressing member is formed with a through-hole that is defined by a bole-defining wall, and a first mounting stud that projects from said hole-defining wall into said through-hole, said sliding plate being formed with a rib that projects into said through-hole, and a second mounting stud that projects from said rib toward said first mounting stud, said interlocking mechanism further including a coil spring that is sleeved on said first and second mounting studs so as to urge said sliding plate to move to said locking position when said pressing member is positioned at said pressing position.

6. The fastening unit of claim 5, wherein said side walls of said pressing member are formed with guiding protrusions projecting therefrom into said plate-receiving space and cooperatively defining two opposing guide channels thereunder, said sliding plate having two opposite sides that are respectively formed with two opposing wings that are slidingly received in said guiding channels.

7. The fastening unit of claim 4, wherein said interlocking mechanism further includes a limiting tongue that projects from said leg in said third transverse direction away from said first end of said base wall and that is disposed at a position adjacent to said second end of said base wall so as to be disposed below and to confront said bar when said pressing member is disposed at said pressing position, thereby preventing rotation of said pressing member in a second direction opposite to said first direction.

8. The fastening unit of claim 1, wherein said mounting walls respectively have pivot ends that are respectively formed with two opposing grooves, said seat further including a supporting wall that extends between and that interconnects said pivot ends of said mounting walls and that is formed wit a notch which opens downwardly and which is defined by a notch-defining wall, said notch-defining wall having a top wall portion that is disposed above said grooves and that defines said first engaging member of said interlocking mechanism, said pressing member being adapted to be disposed above the portion of the respective one of the brackets and including a base wall that has first and second ends and two opposite sides transverse to said first and second ends and parallel to said mounting walls, that defines said pressing part of said pressing member, that is adapted to abut against the portion of the respective one of the brackets when said pressing member is disposed at said pressing position, and that is adapted to move away from the portion of the respective one of the brackets when said member is moved from said pressing position to said releasing position, said pressing member further including a pair of pivot studs that project oppositely from said second end of said base wall at said opposite sides of said base wall into said grooves, and a curved wall that is formed with an elastic part having an engaging protrusion which defines said second engaging member of said interlocking mechanism and that extends curvedly from said first end of said base wall toward said second end of said base wall in such a manner that said engaging protrusion elastically engages said top wall portion of said notch-defining wall when said pressing member is disposed at said pressing position, said elastic part being elastic so as to permit disengagement between said engaging protrusion and said top wall portion of said notch-defining wall upon being pressed, thereby permitting rotation of said pressing member from said pressing position to said releasing position.

* * * * *